United States Patent
Reyzin et al.

(10) Patent No.: US 6,918,431 B2
(45) Date of Patent: Jul. 19, 2005

(54) COOLING ASSEMBLY

(75) Inventors: Ilya Reyzin, Williamsville, NY (US);
Mohinder Singh Bhatti, Amherst, NY (US); Debashis Ghosh, Amherst, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/646,505

(22) Filed: Aug. 22, 2003

(65) Prior Publication Data

US 2005/0039881 A1 Feb. 24, 2005

(51) Int. Cl.⁷ .............................................. H05K 7/20
(52) U.S. Cl. ......................... 165/104.21; 165/104.33; 361/700
(58) Field of Search ................. 165/104.21, 104.33, 165/80.4; 361/700

(56) References Cited

U.S. PATENT DOCUMENTS

| | | | |
|---|---|---|---|
| 5,308,920 A | * 5/1994 | Itoh | 174/15.2 |
| 5,508,884 A | 4/1996 | Brunet et al. | 361/698 |
| 5,694,295 A | * 12/1997 | Mochizuki et al. | 361/699 |
| 6,082,443 A | * 7/2000 | Yamamoto et al. | 165/104.26 |
| 6,365,964 B1 | 4/2002 | Koors et al. | |
| 6,424,529 B2 | 7/2002 | Eesley et al. | |
| 6,424,531 B1 | 7/2002 | Bhatti et al. | |
| 6,588,498 B1 | 7/2003 | Reyzin et al. | |
| 6,639,798 B1 | 10/2003 | Jeter et al. | |
| 2002/0020517 A1 | * 2/2002 | Hsu | 165/80.3 |

FOREIGN PATENT DOCUMENTS

| | | | | |
|---|---|---|---|---|
| JP | 11023166 A | * | 1/1999 | F28D/15/02 |
| JP | 2000028281 A | * | 1/2000 | F28D/15/02 |

* cited by examiner

Primary Examiner—Allen J. Flanigan
(74) Attorney, Agent, or Firm—Patrick M. Griffin

(57) ABSTRACT

A cooling assembly having a base plate and a condenser plate. An outer wall interconnects the base plate to the condenser plate to define a sealed chamber with a working fluid being disposed within the sealed chamber. Intersecting partition walls are mounted to the condenser plate and are angled downwardly toward the base plate for directing working fluid on the condenser plate down a corner of the walls toward a portion of the base plate. Preferably, the base plate defines a first circumference and the condenser plate defines a second circumference larger than the first circumference such that the outer wall has an angled configuration extending between the base plate and the condenser plate to provide a larger area within the sealed chamber for a vapor phase of the working fluid than a liquid phase of the working fluid.

19 Claims, 4 Drawing Sheets

COOLING ASSEMBLY

BACKGROUND OF THE INVENTION

1. Field of the Invention

The subject invention relates to cooling assemblies such as heat sinks for dissipating heat energy generated by electronic or non-electronic components.

2. Description of Related Art

Intense research is in progress to develop cooling assemblies or heat sinks for the electronics industry that are capable of efficiently dissipating heat from electronic and non-electronic components. Cooling of high heat flux components, such as chips, calls for the design of very efficient thermal management systems.

Examples of prior art cooling assemblies designed for cooling the high heat flux electronic components are shown in U.S. Pat. Nos. 5,508,884 and 6,082,443. These assemblies include a boiling section and a condensing section defining a chamber therebetween. Typically, the condensing section has a plurality of fins disposed on an external surface thereof. The heat generating component is connected to the internal or external surface of the boiling section. A working fluid, such as a halocarbon fluid, is disposed within the chamber. The captive working fluid changes from liquid-to-vapor in the boiling section as the working fluid absorbs heat from the heat generating component. Reverse transformation of the working fluid from vapor-to-liquid occurs as the working fluid rejects heat to a cooling fluid, such as air, flowing on the finned external surface of the condensing section. In particular, the vapor transforms to liquid once the vapor hits the condensing section. These prior art assemblies rely exclusively on gravity for the motion of the working fluid between the boiling and condensing sections. In particular, small droplets of liquid form on the condensing section and then drip through the vapor cloud. A fluid moving device, such as an axial fan, is typically disposed near the external surface of the condensing section to provide the necessary air flow across the condensing section.

All of the known prior art cooling assemblies include rectangular chambers with more or less equal surface area for both boiling and condensing. The heat generating components produce highly concentrated areas of heat such that it would be desirable that the boiling area be less than the condensing area and that the working fluid be concentrated in the areas of high heat flux. Another shortcoming of the rectangular chambers of the prior art cooling assemblies is that these chambers require a relatively large inventory of working fluid. In addition, the process of having the re-condensed liquid drip through the vapor cloud is undesirable as the efficiency of the evaporation process suffers. Further, the relatively large rectangular boiling sections can deflect or bow outwardly as the pressure within the chamber increases. This undesirable deflection of the boiling section can cause delamination of the heat generating component from the boiling section.

SUMMARY OF THE INVENTION AND ADVANTAGES

The subject invention includes a cooling assembly for dissipating heat energy generated by an electrical or non-electrical component. The assembly comprises a base plate adapted to be mounted to the component. A condenser plate is disposed above the base plate. An outer wall interconnects the base plate to the condenser plate to define a sealed chamber therebetween. A working fluid is disposed within the sealed chamber with the working fluid having a liquid phase and a vapor phase such that during an operation of the cooling assembly, the liquid phase of the working fluid is disposed over the base plate and the vapor phase of the working fluid is disposed between the liquid phase and the condenser plate. At least one partition wall is mounted to the condenser plate to at least partially divide the sealed chamber with the partition wall angling downwardly toward the base plate for directing working fluid on the condenser plate toward a predefined portion of the base plate, thereby promoting efficient dissipation of heat energy.

The subject invention also includes the base plate defining a first circumference and the condenser plate defining a second circumference larger than the first circumference such that the outer wall has an angled configuration extending between the base plate and the condenser plate to provide a larger area within the sealed chamber for the vapor phase of the working fluid than the liquid phase of the working fluid, thereby further promoting efficient dissipation of heat energy.

Accordingly, the subject invention overcomes the shortcomings of the prior art by providing a wedge shaped cooling assembly having a condenser plate larger than a base or boiler plate and by providing a partition for directing the working fluid to the highly concentrated areas of heat on the base plate. The relatively smaller base plate reduces the total force experienced by the base plate which virtually eliminates the possibility of the base plate deflecting. Hence, the component remains attached to the base plate and higher pressure working fluids can be used.

BRIEF DESCRIPTION OF THE DRAWINGS

Other advantages of the present invention will be readily appreciated as the same becomes better understood by reference to the following detailed description when considered in connection with the accompanying drawings wherein.

DETAILED DESCRIPTION OF THE INVENTION

Figure 1:
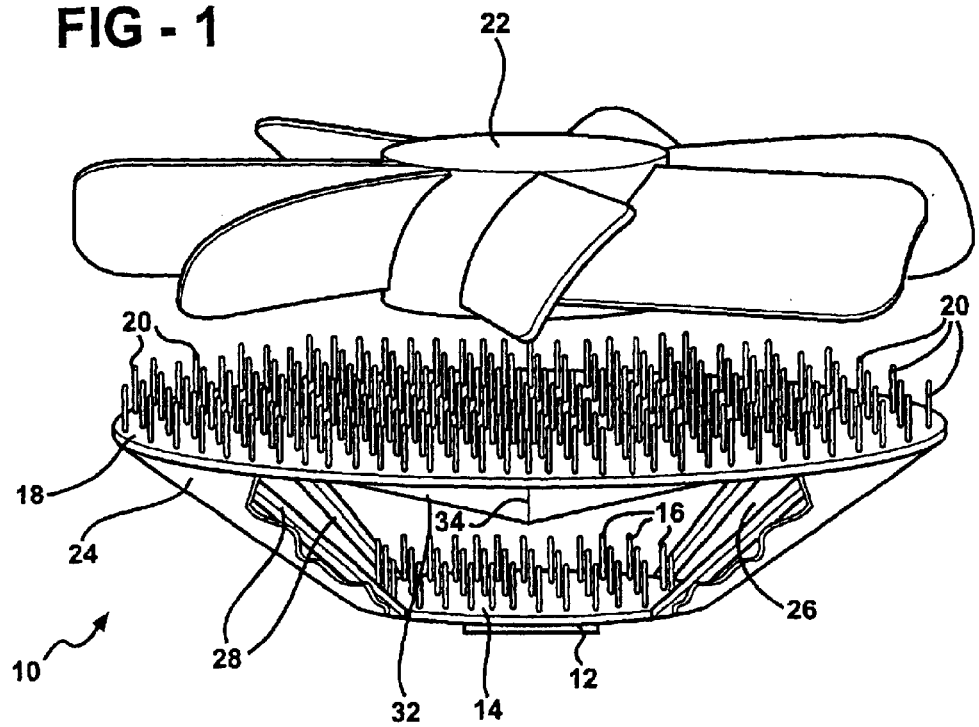
FIG. 1 is a partially fragmented perspective view of the subject invention.
Figure 3:
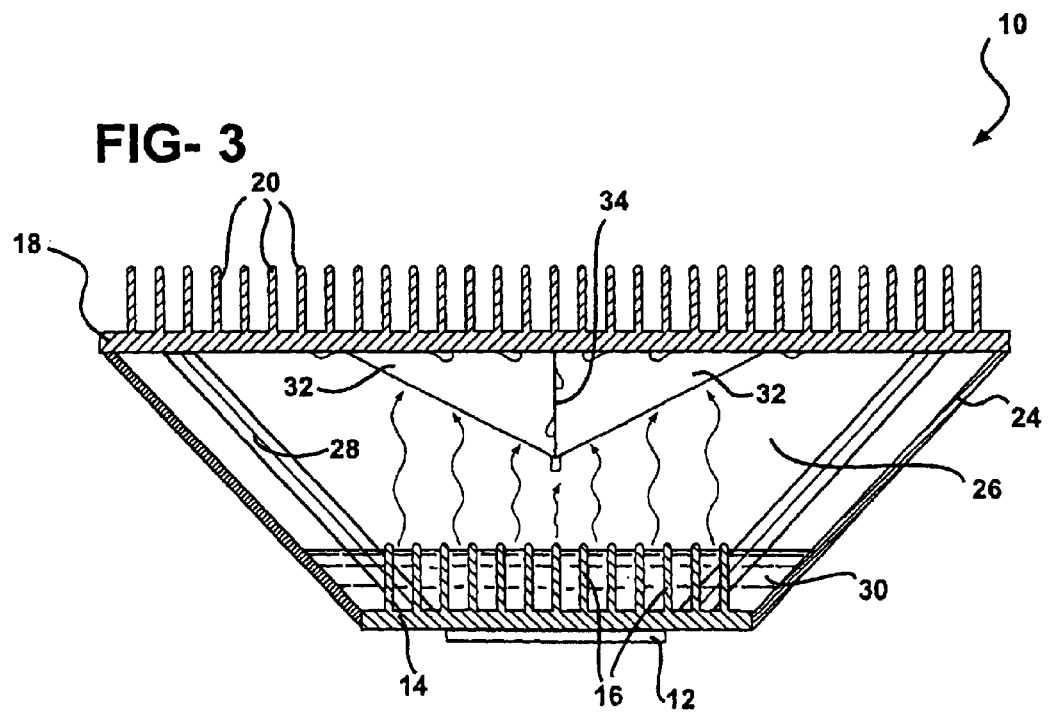
FIG. 3 is a cross-sectional side view of the subject invention.
Figure 2:
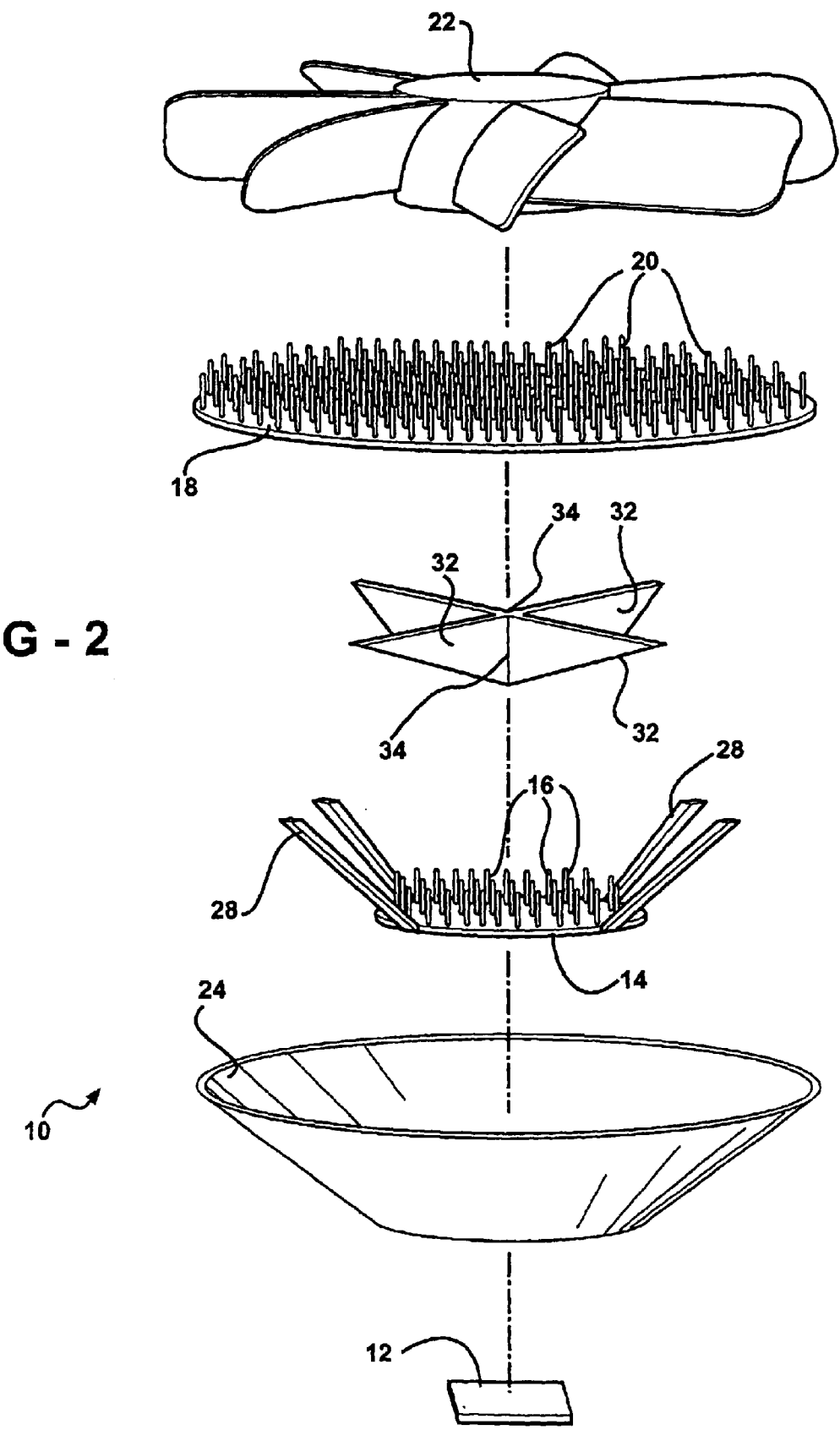
FIG. 2 is an exploded view of the subject invention.

Referring to the Figures, wherein like numerals indicate like or corresponding parts throughout the several views, a cooling assembly in accordance with a first embodiment of the subject invention is generally shown at 10 in FIGS. 1–3. The cooling assembly 10, also known in the art as a heat sink, dissipates heat energy generated by an electrical or non-electrical component 12. Some electrical components 12 include chips for lap top computers and hand held electronic devices. It should be appreciated that the electrical or non-electrical component 12 may be any suitable device known to those skilled in the art.

The cooling assembly 10 comprises a base plate 14 adapted to be mounted to the component 12. The base plate 14 is also known in the art as a boiler plate. A plurality of fins 16 are mounted to the base plate 14 to improve the dissipation of heat energy. Preferably, the fins 16 are pin shaped and are disposed on an internal surface of the base plate 14. The fins 16 may be arranged in a uniform manner, such as shown, or in a non-uniform manner. Also, the fins 16 may be of any suitable density or height. The base plate 14 defines a first circumference and preferably has a curved outer configuration. Even more preferably, the base plate 14 has a substantially circular outer configuration. The base plate 14 could be imparted with additional treatment such as sand blasting, electrochemical etching, and sputter coating to enhance the heat transfer characteristics of the base plate 14.

A condenser plate 18 is disposed above the base plate 14. Similarly, a plurality of fins 20 are mounted to the condenser plate 18 to further improve the dissipation of heat energy. The fins 20 are also pin shaped and are disposed on an external surface of the condenser plate 18. The fins 20 may be arranged in a uniform manner, such as shown, or in a non-uniform manner. Also, the fins 20 may be of any suitable density or height. It should be appreciated, that fins 20 may also be provided on the internal surface of the condenser plate 18.

A fan 22 is centrally disposed over the condenser plate 18 to circulate a flow of air across the finned condenser plate 18. The fan 22 could be placed over the fins 20, as shown, inside the fins 20, or ducted to the fins 20. It should be appreciated that any suitable fan, such as an axial fan, or any orientation of the fan may be utilized without deviating from the scope of the subject invention.

The condenser plate 18 defines a second circumference larger than the first circumference of the base plate 14. The larger condenser plate 18 also has a curved outer configuration complementary with the curved outer configuration of the base plate 14. Preferably, the condenser plate 18 has a substantially circular outer configuration. The circular outer configuration is ideal for operating at maximum effectiveness in conjunction with air moving fans 22, which by their very nature are circular. Most preferably, the second circumference of the circular condenser plate 18 is at least twice as large as the first circumference of the circular base plate 14. It is also advantageous to have the base plate 14 be relatively small. As discussed above, the relatively small base plate 14 resists deflection or bowing due to pressure buildup within the assembly 10. This will ensure that the electrical or non-electrical component 12 will remain attached to the base plate 14.

An outer wall 24 interconnects the base plate 14 to the condenser plate 18 to define a sealed chamber 26 therebetween. The outer wall 24 has an angled configuration extending between the smaller base plate 14 and the larger condenser plate 18. The curved outer configurations of the base 14 and condenser plates 18 define a curved outer wall 24 that angles upwardly from the base plate 14 to the condenser plate 18. Preferably, the curved outer wall 24 is defined as a frustoconical outer wall 24.

Reinforcement ribs 28 extend between the base plate 14 and the condenser plate 18 within the outer wall 24. The ribs 28 run preferably parallel with the outer wall 24 such that the ribs 28 are angled outwardly from the base plate 14 to the condenser plate 18. The incorporation of the ribs 28 allow the outer wall 24 to be formed of a thinner and lighter material. Also, the configuration of the base plate 14, condenser plate 18, ribs 28, and outer wall 24 allow for a compact and cost effective design.

As shown in FIG. 3, a working fluid 30 is disposed within the sealed chamber 26 with the working fluid 30 having a liquid phase and a vapor phase. The working fluid 30 may be of any suitable form including, but not limited to, halocarbon fluids or refrigerants such as R-134a. Higher pressure working fluids 30, such as R-134a, can be used due to the unique configuration of the subject invention, in particular the base plate 14. During an operation of the cooling assembly 10, the liquid phase of the working fluid 30 is disposed over the base plate 14 and the vapor phase of the working fluid 30 is disposed between the liquid phase and the condenser plate 18. As discussed above, the outer wall 24 has an angled configuration extending between the smaller base plate 14 and the larger condenser plate 18 which provides a larger area within the sealed chamber 26 for the vapor phase of the working fluid 30 than the liquid phase of the working fluid 30, thereby promoting efficient dissipation of heat energy. This configuration also provides for reduced working fluid 30 inventory. The liquid phase of the working fluid 30 defines a liquid level which is preferably at an upper distal end of the fins 16 on the base plate 14.

The captive working fluid 30 changes from liquid-to-vapor at the base plate 14 as the working fluid 30 absorbs heat from the component 12. Reverse transformation of the working fluid 30 from vapor-to-liquid occurs as the working fluid 30 rejects heat to a cooling fluid, such as air, flowing on the finned external surface of the condenser plate 18. In particular, the vapor transforms to liquid once the vapor encounters the condenser plate 18. The working fluid 30 forms small liquid droplets on the internal surface of the condenser plate 18 which fall downward toward the base plate 14 and are reintroduced to the liquid phase of the working fluid 30.

At least one partition wall 32 is mounted to the condenser plate 18 to at least partially divide the sealed chamber 26. The partition wall 32 reinforces the structural integrity of the condenser plate 18. The partition wall 32 angles downwardly toward the base plate 14 for directing working fluid 30 on the condenser plate 18 toward a predefined portion of the base plate 14, thereby further promoting efficient dissipation of heat energy. The predefined portion or portions on the base plate 14 will be the areas on the base plate 14 where the heat concentration is the greatest. With the unique configuration of the partition wall 32, the small droplets of liquid are redirected toward those concentrated areas of heat on the base plate 14.

Preferably, the at least one partition wall 32 further includes at least two partition walls 32 intersecting each other to form at least two corners 34 for directing the working fluid 30 on the condenser plate 18 toward the predefined portion of the base plate 14. Surface tension effect draws the small droplets of liquid along the partition wall 32 until the droplets encounter a corner 34 in which case gravity draws the droplets down toward the base plate 14. In the most preferred embodiment, the at least two partition walls 32 preferably intersect each other to form at least four corners 34 for directing the working fluid 30. The at least two partition walls 32 are most preferably planar and intersect each other at substantially right angles. Also, the partition walls 32 may extend substantially across the condenser plate 18. The at least two partition walls 32 are substantially triangular and angle downwardly toward a central portion of the base plate 14 for directing the working fluid 30 on the condenser plate 18 toward the central portion of the base plate 14. In other words, the droplets or liquid are delivered to the central portion of the base plate 14. Hence, in the embodiment shown, the predefined portion of the base plate 14 is the central portion of the base plate 14 which, in this example, will have the highest concentration of heat. This partition wall design reduces the undesirable affect of having the droplets of liquid drip through the vapor cloud.

Figure 4:
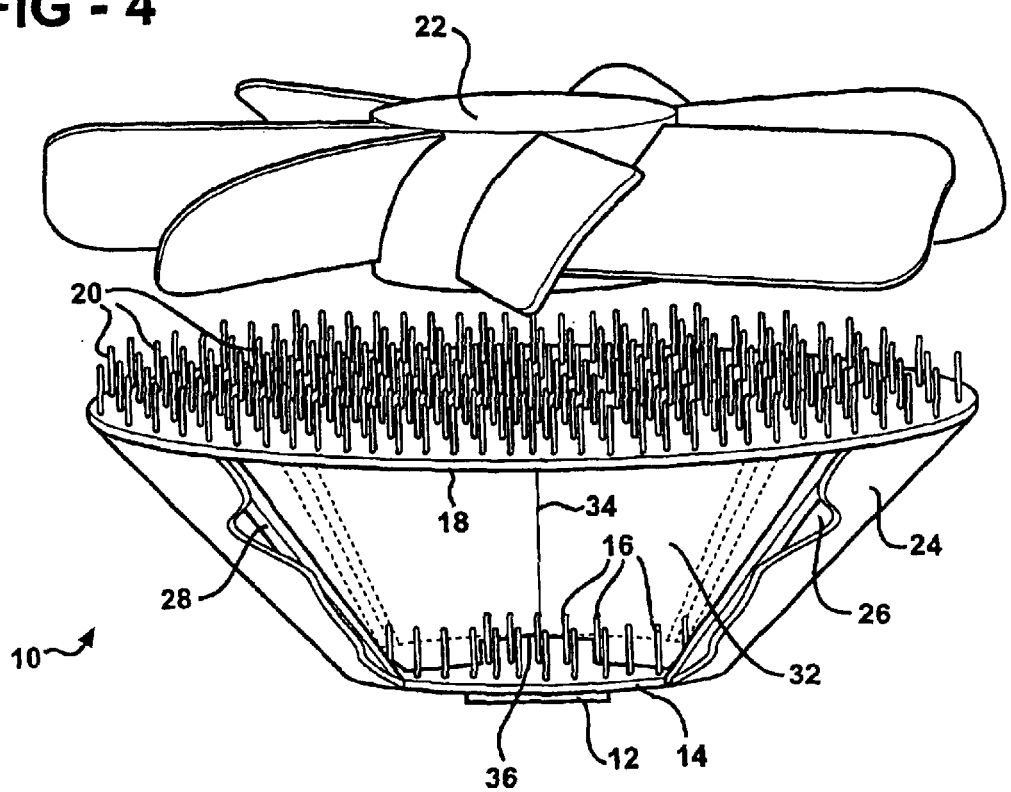
FIG. 4 is a partially fragmented perspective view of an alternative embodiment of the subject invention.
Figure 6:
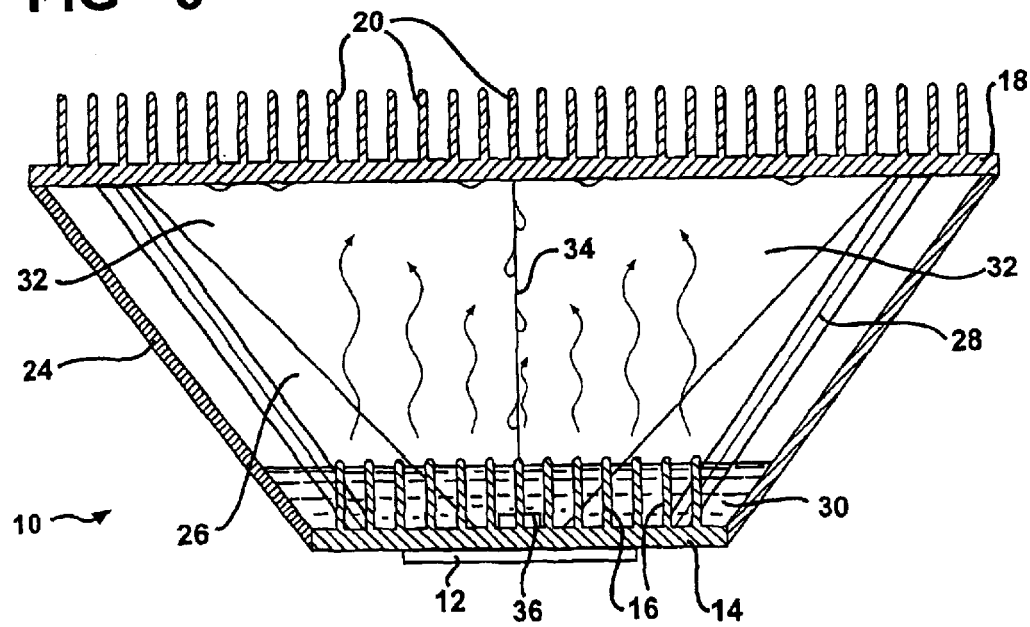
FIG. 6 is a cross-sectional side view of the alternative embodiment.
Figure 5:
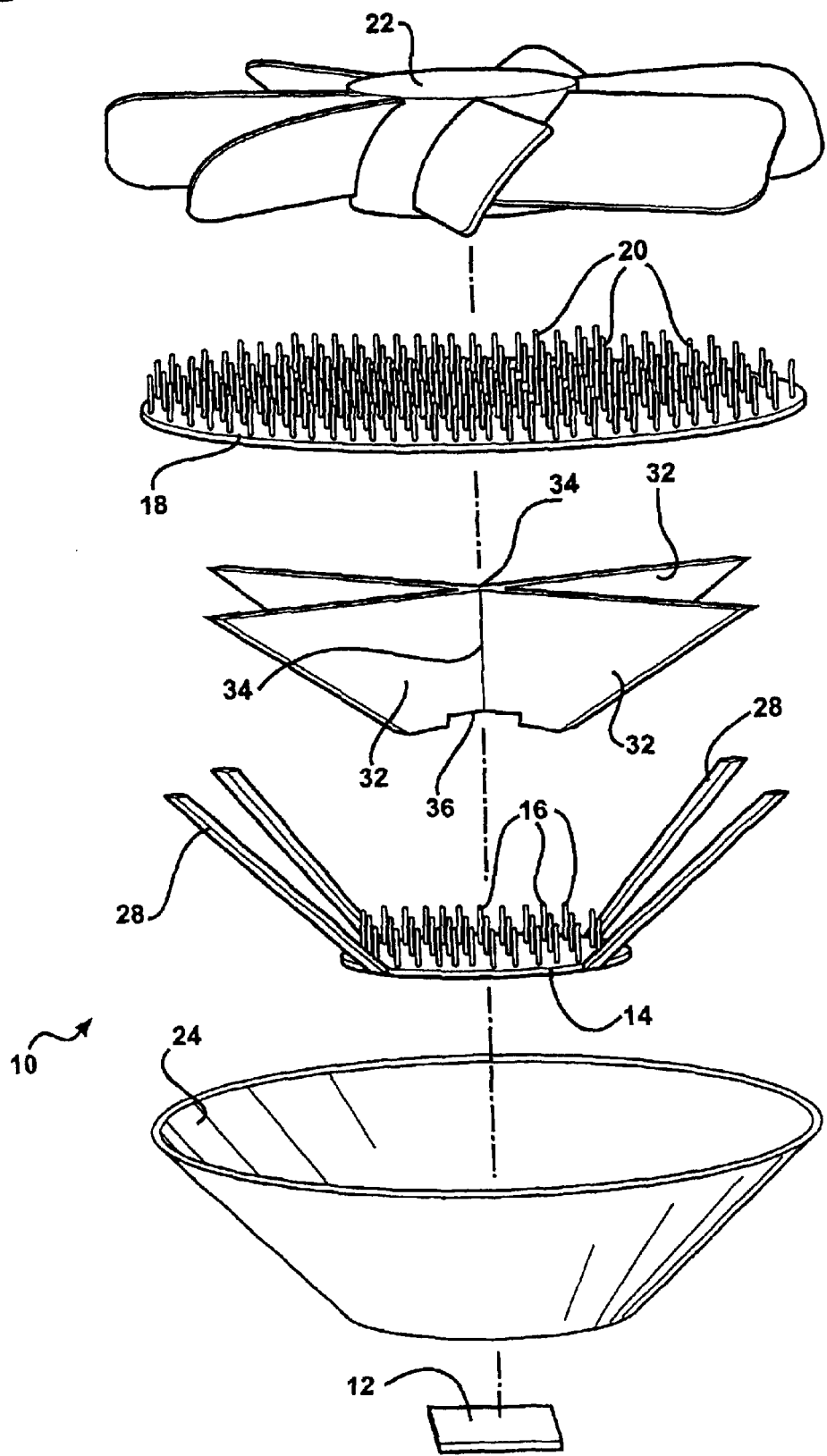
FIG. 5 is an exploded view of the alternative embodiment.

In the preferred embodiment of FIGS. 1–3, the partition walls remain above the base plate 14 and the liquid phase of the working fluid 30. Alternatively, as shown in FIGS. 4–6, the partition walls 32 abut the base plate 14. This design not only directs droplets of liquid to the base plate 14, but also stiffens the entire assembly by also interconnecting the base plate 14 to the condenser plate 18. A notch 36 can be formed within the partition walls 32 to ensure fluid communication within the divided chamber 26. The remaining aspects of the alternative embodiment of FIGS. 4–6 are substantially the same as in the first embodiment of FIGS. 1–3. Each of the structural components in both embodiments, such as the base plate 14, condenser plate 18, outer wall 24, partition wall(s) 32, fins 16, and ribs 28 are all preferably made of a heat transferring metal.

The invention has been described in an illustrative manner, and it is to be understood that the terminology which has been used is intended to be in the nature of words of description rather than of limitation. As is now apparent to those skilled in the art, many modifications and variations of the present invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. A cooling assembly for dissipating heat energy generated by a component, said assembly comprising:
    a base plate adapted to be mounted to the component;
    a condenser plate disposed above said base plate;
    an outer wall interconnecting said base plate to said condenser plate to define a sealed chamber therebetween;
    a working fluid disposed within said sealed chamber with said working fluid having a liquid phase and a vapor phase such that during an operation of said cooling assembly, said liquid phase of said working fluid is disposed over said base plate and said vapor phase of said working fluid is disposed between said liquid phase and said condenser plate;
    at least one partition wall mounted to said condenser plate to at least partially divide said sealed chamber with said partition wall angling downwardly toward said base plate for directing working fluid on said condenser plate toward a predefined portion of said base plate, thereby promoting efficient dissipation of heat energy; and
    a plurality of fins mounted to at least one of said base plate and said condenser plate to improve the dissipation of heat energy.

2. An assembly as set forth in claim 1 wherein said at least one partition wall further includes at least two partition walls intersecting each other to form at least two corners for directing said working fluid on said condenser plate toward said predefined portion of said base plate.

3. An assembly as set forth in claim 2 wherein said at least two partition walls intersect each other to form at least four corners for directing said working fluid.

4. An assembly as set forth in claim 3 wherein said at least two partition walls are planar and intersect each other at substantially right angles.

5. An assembly as set forth in claim 4 wherein said at least two partition walls are substantially triangular and angle downwardly toward a central portion of said base plate for directing said working fluid on said condenser plate toward said central portion of said base plate.

6. An assembly as set forth in claim 3 wherein said partition walls remain above said base plate and said liquid phase of said working fluid.

7. An assembly as set forth in claim 3 wherein said partition walls extend substantially across said condenser plate.

8. An assembly as set forth in claim 1 wherein said condenser plate is larger than said base plate, and both of said base and condenser plates having a substantially circular outer configuration defining a frustoconical outer wall.

9. An assembly as set forth in claim 1 further including reinforcement ribs extending between said base plate and said condenser plate.

10. An assembly as set forth in claim 1 wherein said plurality of fins are mounted to said base plate to improve the dissipation of heat energy.

11. An assembly as set forth in claim 10 wherein said plurality of fins are also mounted to said condenser plate to further improve the dissipation of heat energy.

12. An assembly as set forth in claim 3 wherein said partition walls abut said base plate.

13. An assembly as set forth in claim 12 further including a notch formed within said partition walls to ensure fluid communication within said divided chamber.

14. A cooling assembly for dissipating heat energy generated by a component, said assembly comprising:
    a base plate adapted to be mounted to the component;
    a condenser plate disposed above said base plate;
    an outer wall interconnecting said base plate to said condenser plate to define a sealed chamber therebetween;
    a working fluid disposed within said sealed chamber with said working fluid having a liquid phase and a vapor phase such that during an operation of said cooling assembly, said liquid phase of said working fluid is disposed over said base plate and said vapor phase of said working fluid is disposed between said liquid phase and said condenser plate;
    said base plate defining a first circumference and said condenser plate defining a second circumference larger than said first circumference such that said outer wall has an angled configuration extending between said base plate and said condenser plate to provide a larger area within said sealed chamber for said vapor phase of said working fluid than said liquid phase of said working fluid, thereby promoting efficient dissipation of heat energy; and
    at least one partition wall mounted to said condenser plate to at least partially divide said sealed chamber with said partition wall angling downwardly toward said base plate for directing working fluid on said condenser plate toward a predefined portion of said base plate to further promote the efficient dissipation of heat energy.

15. An assembly as set forth in claim 14 wherein said base plate has a curved outer configuration and said condenser plate has a curved outer configuration to define a curved outer wall that angles upwardly from said base plate to said condenser plate.

16. An assembly as set forth in claim 15 wherein said base plate and said condenser plate each have a substantially circular outer configuration defining a frustoconical outer wall.

17. An assembly as set forth in claim 16 wherein said second circumference of said circular condenser plate is at least twice as large as said first circumference of said circular base plate.

18. An assembly as set forth in claim 14 further including reinforcement ribs extending between said base plate and said condenser plate.

19. An assembly as set forth in claim 14 further including a plurality of fins mounted to said base plate and a plurality of fins mounted to said condenser plate to improve the dissipation of heat energy.

* * * * *